US012518987B2

(12) United States Patent
Son

(10) Patent No.: US 12,518,987 B2
(45) Date of Patent: Jan. 6, 2026

(54) EQUIPMENT FRONT END MODULE, OPERATING METHOD THEREOF, AND SUBSTRATE PROCESSING APPARATUS INCLUDING SAME

(71) Applicant: SEMES CO., LTD., Chungcheongnam-do (KR)

(72) Inventor: Duk Hyun Son, Chungcheongnam-do (KR)

(73) Assignee: SEMES CO., LTD., Chungcheongnam-do (KR)

( * ) Notice: Subject to any disclaimer, the term of this patent is extended or adjusted under 35 U.S.C. 154(b) by 348 days.

(21) Appl. No.: 18/083,478

(22) Filed: Dec. 17, 2022

(65) Prior Publication Data

US 2023/0411186 A1    Dec. 21, 2023

(30) Foreign Application Priority Data

Jun. 15, 2022    (KR) .......................... 10-2022-0072749

(51) Int. Cl.
    *H01L 21/67*    (2006.01)
(52) U.S. Cl.
    CPC .............................. *H01L 21/67201* (2013.01)
(58) Field of Classification Search
    CPC ......... H01L 21/67017; H01L 21/67389; H01L 21/67393; H01L 21/67769
    See application file for complete search history.

(56) References Cited

U.S. PATENT DOCUMENTS 10,566,216 B2 *    2/2020    Senn ................. H01L 21/67778
10,796,935 B2    10/2020    Wyatt et al.
11,244,844 B2    2/2022    Reuter et al.
11,508,593 B2    11/2022    Reuter et al.
11,791,185 B2    10/2023    Reuter et al.
2018/0374725 A1 *    12/2018    Holeyannavar ... H01L 21/67769
(Continued)

FOREIGN PATENT DOCUMENTS

CN    109786285 A *    5/2019    ............. H01L 21/02
JP    2011-119396    6/2011
(Continued)

OTHER PUBLICATIONS

Office Action dated Feb. 27, 2024 for Japanese Patent Application No. 2022-197721 and its English translation from Global Dossier.

*Primary Examiner* — Michael G Hoang
*Assistant Examiner* — Michael James Giordano
(74) *Attorney, Agent, or Firm* — WOMBLE BOND DICKINSON (US) LLP

(57) ABSTRACT

Provided is an equipment front end module which can effectively control internal humidity by efficiently circulating an inert gas. The equipment front end module comprises: a module chamber; a side storage installed on a first surface of the module chamber and capable of storing a plurality of substrates therein; an inert gas supplier configured to supply an inert gas into the module chamber, a first exhaust line configured to connect the side storage and an exhaust device; and a flow rate controller installed in the first exhaust line. The inert gas passes through the side storage from the module chamber and flows along the first exhaust line, and the flow rate controller controls a flow rate of the inert gas passing through the side storage.

18 Claims, 12 Drawing Sheets

(56) References Cited

U.S. PATENT DOCUMENTS

| | | | |
|---|---|---|---|
| 2019/0267258 A1* | 8/2019 | Rice | H01L 21/67017 |
| 2020/0135521 A1* | 4/2020 | Reuter | H01L 21/67393 |
| 2020/0135522 A1* | 4/2020 | Reuter | H01L 21/67017 |

FOREIGN PATENT DOCUMENTS

| | | |
|---|---|---|
| JP | 2014-38888 | 2/2014 |
| JP | 2020-510319 | 4/2020 |
| JP | 2022-505396 | 1/2022 |
| JP | 2022-505397 | 1/2022 |
| KR | 10-2021-0066935 | 6/2021 |
| KR | 10-2021-0068576 | 6/2021 |
| KR | 10-2360219 | 2/2022 |

* cited by examiner

EQUIPMENT FRONT END MODULE, OPERATING METHOD THEREOF, AND SUBSTRATE PROCESSING APPARATUS INCLUDING SAME

CROSS-REFERENCE TO RELATED APPLICATION

This application claims priority from Korean Patent Application No. 10-2022-0072749 filed on Jun. 15, 2022 in the Korean Intellectual Property Office, and all the benefits accruing therefrom under 35 U.S.C. 119, the contents of which in its entirety are herein incorporated by reference.

BACKGROUND

1. Technical Field

The present disclosure relates to an equipment front end module, an operating method thereof, and a substrate processing apparatus including the same.

2. Description of the Related Art

When manufacturing a semiconductor device, a variety of processes such as photography, etching, ashing, ion implantation, thin film deposition, and cleaning are performed within multiple process modules. A substrate is loaded on a carrier (e.g., a front opening unified pod, FOUP) to move further between multiple process modules. A process module for processing substrates and an equipment front end module to transfer substrates between carriers are used.

SUMMARY

A load port serving as an interface is installed on one side of an equipment front end module, while a load lock device is installed on the other side of the equipment front end module. The equipment front end module includes a load/unload robot configured to transfer a substrate, and a side storage configured to temporarily store the substrate.

On the other hand, when the substrate is exposed to relatively high humidity, a relatively high oxygen ($O_2$) level, and a chemical contaminants level, various problems may occur on the substrate. Accordingly, it is necessary to efficiently control the humidity in the equipment front end module.

Aspects of the present disclosure provide an equipment front end module which can effectively control internal humidity by efficiently circulating an inert gas.

Aspects of the present disclosure also provide a substrate processing apparatus including an equipment front end module which can effectively control internal humidity by efficiently circulating an inert gas.

Aspects of the present disclosure also provide an operation method of the equipment front end module.

The technical aspects of the present disclosure are not restricted to those set forth herein, and other unmentioned technical aspects will be clearly understood by one of ordinary skill in the art to which the present disclosure pertains by referencing the detailed description of the present disclosure given below.

Technical Solution

According to an aspect of the present disclosure, there is provided an equipment front end module comprising: a module chamber; a side storage installed on a first surface of the module chamber and capable of storing a plurality of substrates therein; an inert gas supplier configured to supply an inert gas into the module chamber; a first exhaust line configured to connect the side storage and an exhaust device; and a flow rate controller installed in the first exhaust line. The inert gas passes through the side storage from the module chamber and flows along the first exhaust line, and the flow rate controller controls a flow rate of the inert gas passing through the side storage.

According to an aspect of the present disclosure, there is also provided a substrate processing apparatus comprising: an equipment front end module; a load port disposed on a first surface of the equipment front end module and configured to accommodate a substrate carrier; and a load lock device disposed on a second surface of the equipment front end module. The equipment front end module comprises: a module chamber; a fan filter unit installed on an upper surface of the module chamber; a side storage installed on a side surface of the module chamber and capable of storing a plurality of substrates therein; an inert gas supplier configured to supply an inert gas into the module chamber through the side surface of the module chamber; a first exhaust line configured to connect the side storage and an exhaust device; a flow rate controller installed in the first exhaust line and configured to control the speed of the inert gas flowing along the first exhaust line, a second exhaust line configured to connect a bottom surface of the module chamber and the exhaust device; and a circulation line connected to the first exhaust line and the second exhaust line and configured to resupply the inert gas transmitted through the first and second exhaust lines to the fan filter unit.

According to an aspect of the present disclosure, there is also provided an operating method of the equipment front end module comprising: providing an equipment front end module comprising: a module chamber; a side storage installed on a first surface of the module chamber and capable of storing a plurality of substrates therein; an inert gas supplier configured to supply an inert gas into the module chamber; a first exhaust line configured to connect the side storage and the exhaust device; a connection line configured to connect the first exhaust line and a circulation line; and a three-way valve installed in a node where the first exhaust line is connected to the connection line; when the three-way valve is in a first position, allowing at least a part of the inert gas flowing along the first exhaust line to pass through the connection line and the circulation line and be resupplied to the module chamber, and when the three-way valve is in a second position, exhausting the inert gas flowing along the first exhaust line to the exhaust device.

Specific details of other embodiments are included in the detailed description and the drawings.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

Figure 1:
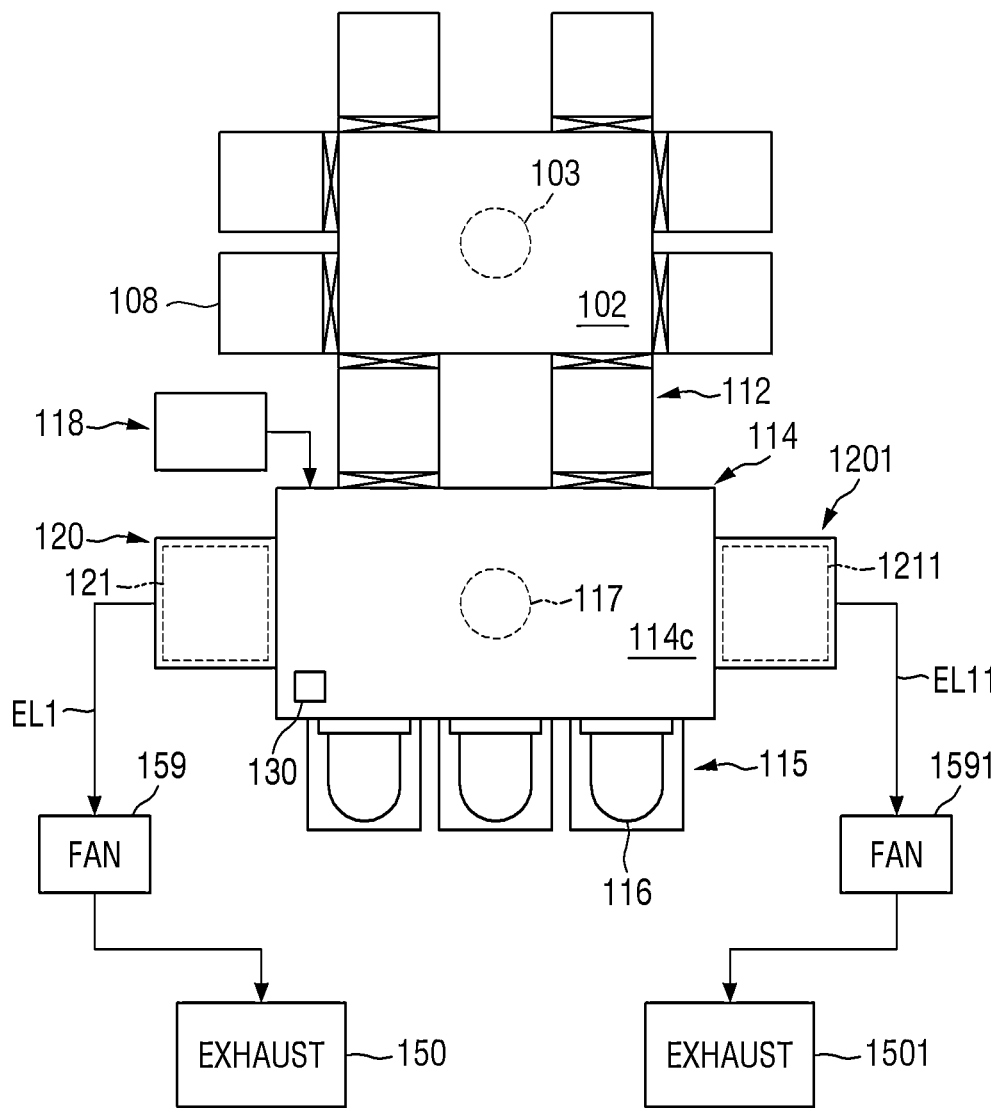
FIG. 1 is a block diagram explaining a substrate processing apparatus according to some embodiments of the present disclosure.
Figure 1:
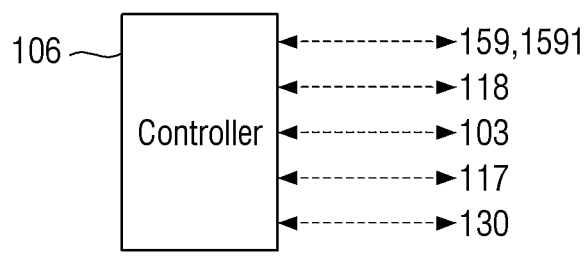

Hereinafter, embodiments of the present disclosure will be described with reference to the attached drawings. The merits and characteristics of the present disclosure and a method for achieving the merits and characteristics will become more apparent from the embodiments described in detail in conjunction with the accompanying drawings. However, the present disclosure is not limited to the disclosed embodiments, but may be implemented in various different ways. The embodiments are provided to only complete the disclosure of the present disclosure and to allow those skilled in the art to understand the category of the present disclosure. The present disclosure is defined by the category of the claims. Like numbers refer to like elements throughout the description of the figures.

The spatially relative terms "below", "beneath", "lower", "above" and "upper" may be used to easily describe the correlation of a device or components with other devices or components. Spatially relative terms are to be understood as including terms in different directions of the device in use or operation in addition to the directions shown in the figures. For example, when flipping a device shown in the figure, a device described as "below" or "beneath" of another device may be placed "above" of another device. Thus, the exemplary term "below" can encompass both an orientation of above and below. The device can also be oriented in other directions, so that spatially relative terms can be interpreted according to orientation.

Although the first, second, etc. are used to describe various elements, components and/or sections, these elements, components and/or sections are of course not limited by these terms. These terms are only used to distinguish one element, component or section from another element, component or section. Therefore, the first device, the first component, or the first section mentioned below may be a second device, a second component, or a second section within the technical spirit of the present disclosure.

Hereinafter, preferred embodiments according to the present disclosure are described in detail with reference to the accompanying drawings. The same or similar elements are assigned the same reference numerals irrespective of their reference numerals, and a redundant description thereof is omitted.

Figure 2:
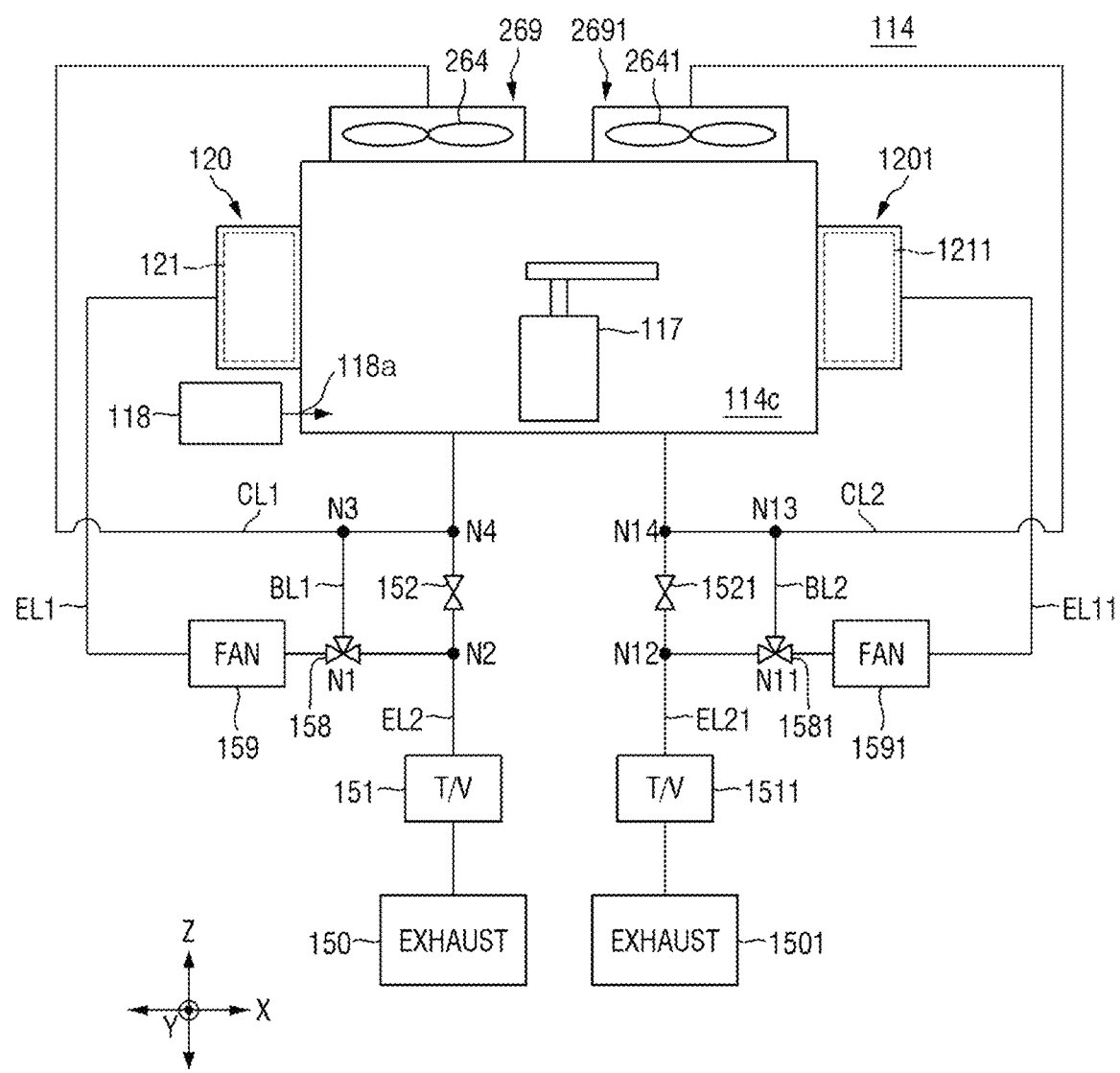
FIG. 2 is a block diagram explaining an equipment front end module according to a first embodiment of the present disclosure.
Figure 3:
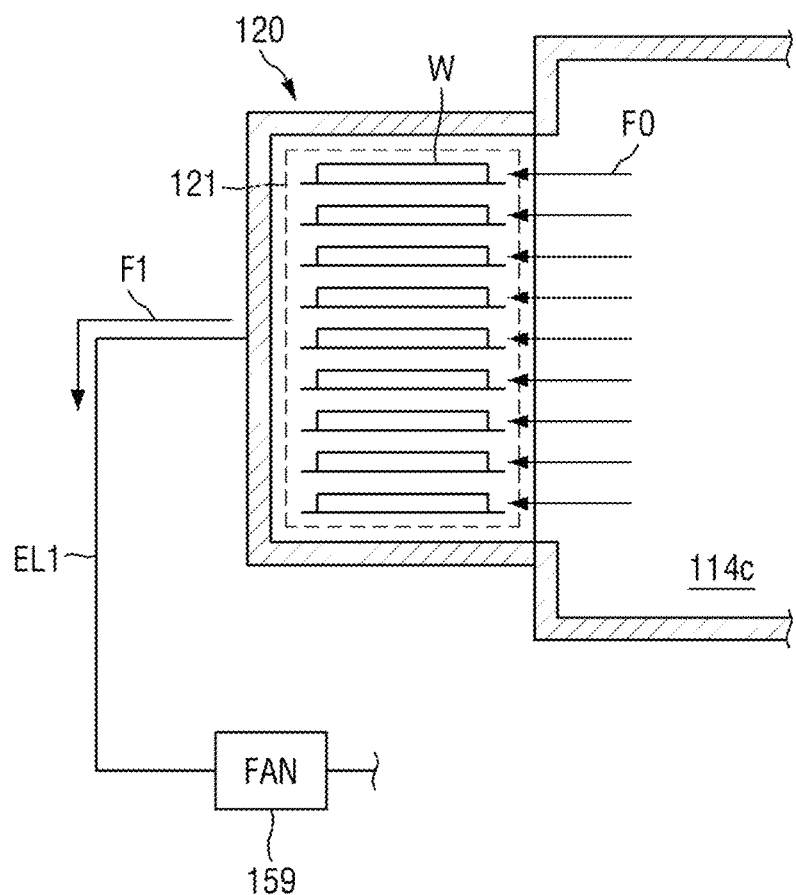
FIG. 3 is a block diagram explaining the side storage illustrated in FIG. 2.

FIG. 1 is a block diagram explaining a substrate processing apparatus according to some embodiments of the present disclosure. FIG. 2 is a block diagram explaining an equipment front end module according to a first embodiment of the present disclosure. FIG. 3 is a block diagram explaining the side storage illustrated in FIG. 2.

Referring to FIG. 1, a substrate processing apparatus according to some embodiments of the present disclosure includes an equipment front end module 114, a load port 115, a load lock device 112, a plurality of process modules 108, and a controller 106. An X direction and a Y direction may be perpendicular to each other, while a Z direction may be perpendicular to the X direction and the Y direction. The Z direction may be an up-and-down direction.

The load port 115 may be provided on one surface (e.g., a front surface) of the equipment front end module 114. The load port 115 may be configured to accommodate at least one carrier 116 (e.g., a front opening unified pod, FOUP). The carrier 116 may be docked to the equipment front end module 114. Although the drawing illustrates that the load port 115 accommodates three carriers 116, the present disclosure is not limited thereto.

The load lock device 112 may be provided on the other surface (e.g., a rear surface) of the equipment front end module 114.

A load/unload robot 117 is disposed in a module chamber 114c of the equipment front end module 114. The load/unload robot 117 accommodates a substrate W in the carrier 116 disposed in the load port 115 and docked to the equipment shear module 114, and transfers the substrate W to the load lock device 112. Alternatively, the load/unload robot 117 transfers the substrate W disposed in the load lock device 112 and/or side storage 120 and 1201 into the carrier 116 docked to the equipment front end module 114. The controller 106 communicates with the load/unload robot 117 and provides a command to the load/unload robot 117 to control various operations of the load/unload robot 117. In other words, a variety of commands from the controller 106 may generate motions of various components of the load/unload robot 117.

Environmental parameters (e.g., humidity, a temperature, an oxygen amount, the amount of inert gas, and the amount of chemical contaminants) of the equipment front end module 114 are monitored and controlled by the controller 106. If these environmental parameters are not controlled according to preset conditions, none of the carriers docked to the equipment front end module 114 may be opened.

The equipment front end module 114 may be provided with an inert gas supplier 118 configured to supply an inert gas into the module chamber 114c. The inert gas may include, for example, at least one of nitrogen, argon, and helium, but the present disclosure is not limited thereto.

In addition, the equipment front end module 114 may include the side storage 120 and 1201 capable of storing a plurality of substrates W.

An exhaust line EL1 connects the first side storage 120 and the exhaust device 150, and an exhaust line EL11 connects the second side storage 1201 and an exhaust device 1501. The first exhaust device 150 and the second exhaust device 1501 may be physically separated from each other or may be one exhaust device. A first flow rate controller 159 may be installed in the exhaust line EL1, and a second flow rate controller 1591 may be installed in the exhaust line EL11. Each of the first flow rate controller 159 and the second flow rate controller 1591 may include a fan. The speed of the inert gas flowing along the exhaust line EL1 and the exhaust line EL11 is determined according to the rotation speed of the fan.

The equipment front end module 114 may be provided with a sensor 130. The sensor 130 may be, for example, a differential pressure sensor. The controller 106 communicates with the sensor 130 and receives a sensing value of the sensor 130, thus controlling at least one of the inert gas supply amount of the inert gas supplier 118, the rotation speed of the first flow rate controller 159, the rotation speed of the second flow rate controller 1591, and a fan filter unit. A control manner may be, for example, a professional-integral-differential (PID) manner, but the present disclosure is not limited thereto. In addition, the equipment front end module 114 may be additionally provided with various kinds of sensors. For instance, a sensor capable of measuring at least one of a humidity level, an oxygen level, and a chemical contaminant level may be installed therein.

A more detailed configuration and operation of the equipment front end module 114 will be described below with reference to FIGS. 2 to 11.

The load lock device 112 is connected to a transfer chamber 102. The transfer chamber 102 has a plurality of surfaces on which a plurality of process modules 108 may be installed. As illustrated, the transfer chamber 102 may have a rectangular shape, but the present disclosure is not limited thereto.

In addition, a transfer robot 103 is disposed in the transfer chamber 102. The transfer robot 103 may place the substrate W in any of the plurality of process modules 108 by the operation of an arm, and take the substrate W out of any one of the plurality of process modules 108. The substrate W includes, for example, a semiconductor wafer, a silicon-containing wafer, a patterned wafer, and a glass substrate. The controller 106 may control the operation of the transfer robot 103 by providing the command. In other words, a variety of commands from the controller 106 may generate the motions of various components of the transfer robot 103. Suitable feedback mechanisms for one or more of the components may be provided by various sensors, such as position encoders.

Each of the plurality of process modules 108 may be coupled to each surface of the transfer chamber 102. The process module 108 may include, for example, plasma vapor deposition (PVD) or chemical vapor deposition (CVD), etching, annealing, pre-cleaning, metal or metal oxide removal.

Herein, the equipment front end module 114 and a configuration related thereto will be described with reference to FIG. 2.

The equipment front end module 114 includes the module chamber 114c, the side storage 120 and 1201, the inert gas supplier 118, exhaust lines EL1, EL2, EL11 and EL21, circulation lines CL1 and CL2, the first flow rate controller 159, the second flow rate controller 1591, fan filter units 269 and 2691.

The inert gas supplier 118 supplies the inert gas into the module chamber 114c. The inert gas can be supplied into the module chamber 114c and then exhausted and circulated, thus effectively controlling the environmental parameters (e.g., humidity, a temperature, an oxygen amount, the amount of inert gas, and the amount of chemical contaminants) in the module chamber 114c.

Meanwhile, the inert gas supplier 118 may supply the inert gas through a sidewall of the module chamber 114c.

A separate space (e.g., plenum) for diffusing the inert gas supplied by the inert gas supplier 118 may not be installed on the sidewall of the module chamber 114c. The inert gas supplied by the inert gas supplier 118 may be supplied to the fan filter units 269 and 269 through the exhaust lines EL1, EL11, EL2 and EL21 and the circulation lines CL1 and CL2 and be sufficiently diffused in the fan filter units 269 and 2691 to get supplied to the entire module chamber 114c.

Since the separate space for diffusing the inert gas is not required, a position 118a where the inert gas supplier 118 supplies the inert gas can be freely designed. For instance, as illustrated, the position 118a where the inert gas is supplied may be installed lower than the position with the side storage 120 and 1201 installed.

The side storage 120 and 1201 may be installed on both side surfaces of the module chamber 114c, respectively. The side storage 120 and 1201 includes the module chamber 114c and storage chambers 121 and 1211 opened to each other and/or communicating with each other. A plurality of shelves capable of storing the plurality of substrates W may be installed in the storage chambers 121 and 1211.

The equipment front end module according to the first embodiment of the present disclosure is provided with the exhaust lines EL1 and EL11 connected to the side storage 120 and 1201, separately from the exhaust lines EL2 and EL21 connected to the module chamber 114c. In addition, since the separate exhaust lines EL1 and EL11 connected to the side storage 120 and 1201 are provided with the flow rate controllers 159 and 1591, the flow rate of the inert gas flowing through the side storage 120 and 1201 can be controlled.

As illustrated in FIG. 3, the inert gas in the module chamber 114c passes between the plurality of substrates W loaded in the first side storage 120 (see reference numeral F0) and flows along the first exhaust line EL1 connected to the first side storage 120 (see reference numeral F1).

The flow rate of the inert gas passing through the first side storage 120 is separately controlled by the first flow rate controller 159. Accordingly, fume and polymer of the plurality of substrates W loaded in the first side storage 120 can be effectively removed. Furthermore, the speed of the inert gas passing between the plurality of substrates W loaded in the first side storage 120 may be maintained constant by the first flow rate controller 159. Accordingly, the plurality of substrates W may be uniformly managed as a whole.

Referring back to FIG. 2, the exhaust lines EL2 and EL21 and/or the exhaust lines EL1 and EL11 are connected to the circulation lines CL1 and CL2. In other words, the inert gas flowing along the exhaust lines EL2 and EL21 and the inert gas flowing along the exhaust lines EL1 and EL11 may be supplied into the module chamber 114c again along the circulation lines CL1 and CL2. This makes it possible to effectively control the humidity in the module chamber 114c while optimizing the flow rate use of the inert gas.

To achieve the aforementioned effects, for example, the exhaust lines EL1, EL11, EL2 and EL21 and the circulation lines CL1 and CL2 may be implemented as follows.

The first exhaust line EL1 connects the first side storage 120 installed on one side (i.e., a first surface) of the module chamber 114c to the first exhaust device 150. The first exhaust line EL1 is provided with the first flow rate controller 159, and the first flow rate controller 159 controls the flow rate of the inert gas flowing along the first exhaust line EL1.

The second exhaust line EL2 is installed on a bottom surface (i.e., a second surface) of the module chamber 114c, and the second exhaust line EL2 connects the bottom surface of the module chamber 114c to the first exhaust device 150.

The first circulation line CL1 is a pipe for circulating the inert gas. The first circulation line CL1 may be connected to at least one of the first exhaust line EL1 and the second exhaust line EL2.

The first connection line BL1 connects the first exhaust line EL1 and the first circulation line CL1. A first node N1 is a part where the first connection line BL1 and the first exhaust line EL1 are connected, and a third node N3 is a part where the first connection line BL1 and the first circulation line CL1 are connected.

The second exhaust line EL2 connects the first exhaust line EL1 and the first circulation line CL1. A second node N2 is a part where the first exhaust line EL1 and the second exhaust line EL2 are connected. A fourth node N4 is a part where the first circulation line CL1 and the second exhaust line EL2 are connected.

A three-way valve 158 is installed at the first node N1. The movement direction of the inert gas flowing along the first exhaust line EL1 may be controlled according to the position of the three-way valve 158.

For instance, when the three-way valve 158 is in the first position, the inert gas flowing along the first exhaust line EL1 may pass through the first connection line BL1 and the first circulation line CL1 (i.e., through the third node N3) and be supplied back (circulated) to the first fan filter unit 269 and the module chamber 114c.

Alternatively, when the three-way valve 158 is in the second position, the inert gas flowing along the first exhaust line EL1 may pass through the second exhaust line EL2 (i.e., through the second node N2) and be exhausted to the first exhaust device 150.

Alternatively, when the three-way valve 158 is in a third position, some of the inert gas flowing along the first exhaust line EL1 may pass through the third node N3 and be supplied back to the module chamber 114c, while the other inert gas may pass through the second node N2 and be exhausted to the first exhaust device 150.

In addition, in the second exhaust line EL2, a first on-off valve 152 is installed between the second node N2 and the fourth node N4. When the first on-off valve 152 is turned on, the inert gas may flow along the second exhaust line EL2 to the first exhaust device 150, and when the first on-off valve 152 is turned off, the inert gas may not flow along the second exhaust line EL2.

A first throttle valve T/V 151 is installed downstream of the second node N2 in the second exhaust line EL2. The opening rate of the first throttle valve 151 can be adjusted to control the amount of the inert gas discharged to the first exhaust device 150. Accordingly, the amount of the inert gas used to adjust the humidity in the module chamber 114c can be controlled.

For instance, when the opening rate of the first throttle valve 151 is a first rate, the inert gas is exhausted to the first exhaust device 150 by a first flow amount. When the opening rate of the first throttle valve 151 is a second rate that exceeds the first rate, the inert gas is exhausted to the first exhaust device 150 by a second flow amount larger than the first flow amount.

Similarly, the third exhaust line EL11 connects the second side storage 1201 installed on the other side of the module chamber 114c to the second exhaust device 1501. The second flow rate controller 1591 is installed in the third exhaust line EL11.

The fourth exhaust line EL21 is installed on the bottom surface of the module chamber 114c, and the fourth exhaust line EL21 connects the bottom surface of the module chamber 114c to the second exhaust device 1501.

The second circulation line CL2 may be connected to at least one of the third exhaust line EL11 and the fourth exhaust line EL21.

A second connection line BL2 connects the third exhaust line EL11 and the second circulation line CL2. A fifth node N11 is a part where the second connection line BL2 and the third exhaust line EL11 are connected, and a seventh node N13 is a part where the second connection line BL2 and the second circulation line CL2 are connected.

The fourth exhaust line EL21 connects the third exhaust line EL11 and the second circulation line CL2. A sixth node N12 is a part where the third exhaust line EL11 and the fourth exhaust line EL21 are connected. An eighth node N14 is a part where the second circulation line CL2 and the fourth exhaust line EL21 are connected.

A three-way valve 1581 is installed in the fifth node N11. The movement direction of the inert gas flowing along the third exhaust line EL11 may be controlled according to the position of the three-way valve 1581.

In addition, in the fourth exhaust line EL21, a second on-off valve 1521 is installed between the sixth node N12 and the eighth node N14.

A second throttle valve T/V 1511 is installed downstream of the sixth node N12 in the fourth exhaust line EL21. The opening rate of the second throttle valve 1511 can be adjusted to control the amount of the inert gas discharged to the second exhaust device 1501.

Meanwhile, the fan filter units 269 and 2691 are installed on an upper surface of the module chamber 114c. Fans 264 and 2641 are installed in the fan filter units 269 and 2691. The controller 106 (see FIG. 1) may adjust a diffusion speed of the inert gas in the module chamber 114c by adjusting the rotation speed of the fans 264 and 2641. In addition, the humidity in the module chamber 114c can be efficiently adjusted.

The first circulation line CL1 is connected to the first fan filter unit 269. At least a part of the inert gas flowing along the first exhaust line EL1 and at least a part of the inert gas flowing along the second exhaust line EL2 may be supplied to the first fan filter unit 269 along the first circulation line CL1.

The second circulation line CL2 is connected to the second fan filter unit 2691. At least a part of the inert gas flowing along the third exhaust line EL11 and at least a part of the inert gas flowing along the fourth exhaust line EL21 may be supplied to the second fan filter unit 2691 along the second circulation line CL2.

Meanwhile, the drawing illustrates the two side storage 120 and 1201 installed on both sides of the module chamber 114c, but the present disclosures is not limited thereto. For instance, only one (e.g., 120) of the two side storage 120 and 1201 may be installed. In that case, only the components (e.g., EL1, 159, 151 and 150) associated with the side storage 120 are installed, and other side storage 1201 and relevant components (e.g., EL11, 1591, 1511 and 1501) are not installed.

Figure 4:
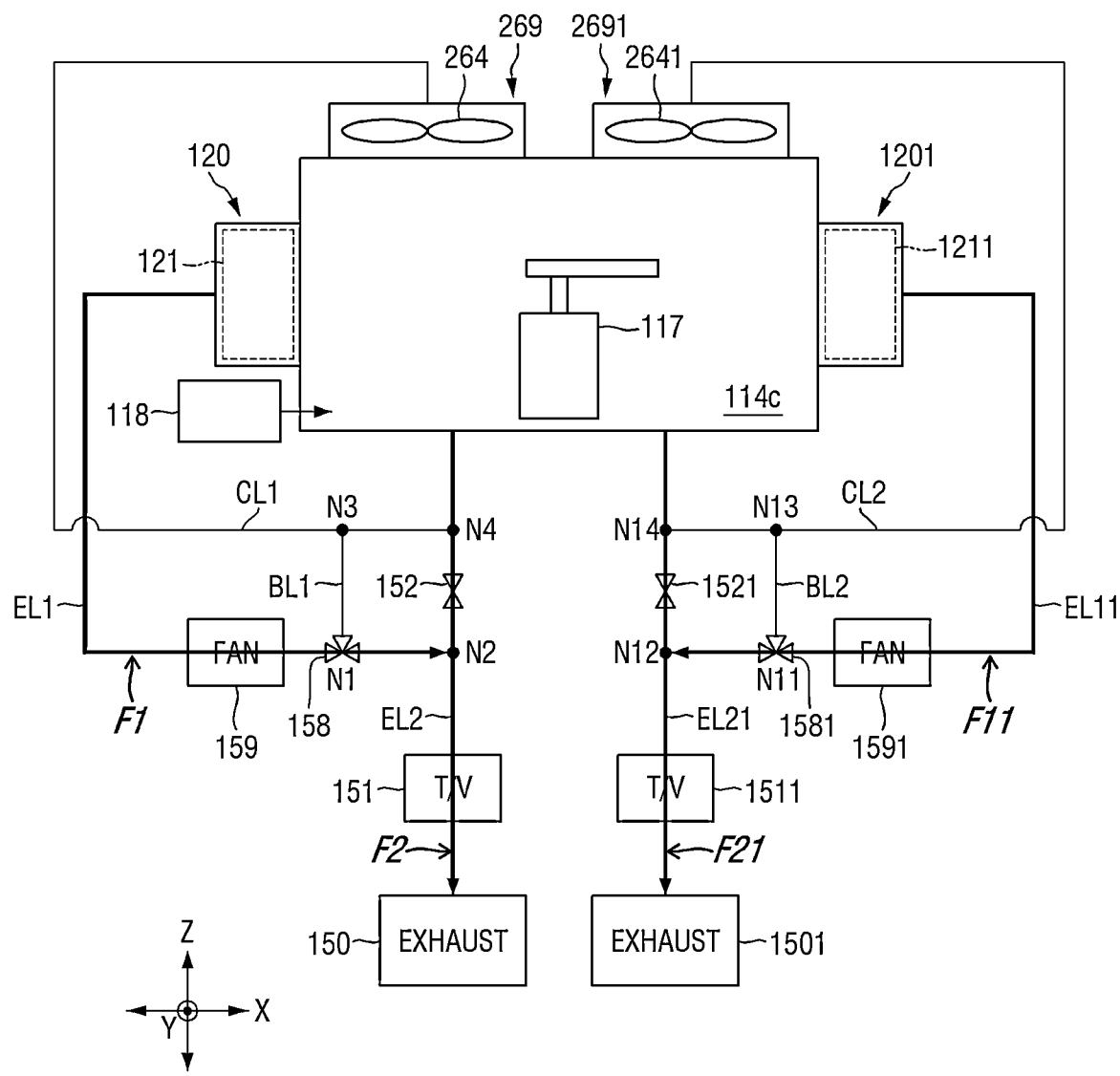
FIG. 4 is a diagram explaining a first operation of the equipment front end module according to a first embodiment of the present disclosure.

FIG. 4 is a diagram explaining a first operation of the equipment front end module according to a first embodiment of the present disclosure.

Referring to FIG. 4, a case where the equipment front end module is in an exhaust mode will be provided.

The first on-off valve 152 and the second on-off valve 1521 are in an on-state, and the three-way valves 158 and 1581 are in the second position.

The inert gas in the module chamber 114c flows along the first exhaust line EL1 through the first side storage 120 and is supplied to the second exhaust line EL2 through the three-way valve 158 (see reference numeral F1).

In addition, the inert gas in the module chamber 114c flows along the second exhaust line EL2 from the bottom surface of the module chamber 114c. The inert gas of the first exhaust line EL1 is joined with the second exhaust line EL2 at the second node N2. The inert gas is exhausted to the first exhaust device 150 through the first throttle valve 151 (see reference numeral F2).

Similarly, the inert gas in the module chamber 114c flows along the third exhaust line EL11 via the second side storage 1201 and is provided to the fourth exhaust line EL21 via the three-way valve 1581 (see reference numeral F11).

In addition, the inert gas in the module chamber 114c flows along the fourth exhaust line EL21 from the bottom surface of the module chamber 114c. In the sixth node N12, the inert gas of the third exhaust line EL11 is joined with the fourth exhaust line EL21. The inert gas is exhausted to the second exhaust device 1501 through the second throttle valve 1511 (see reference numeral F21).

Figure 5:
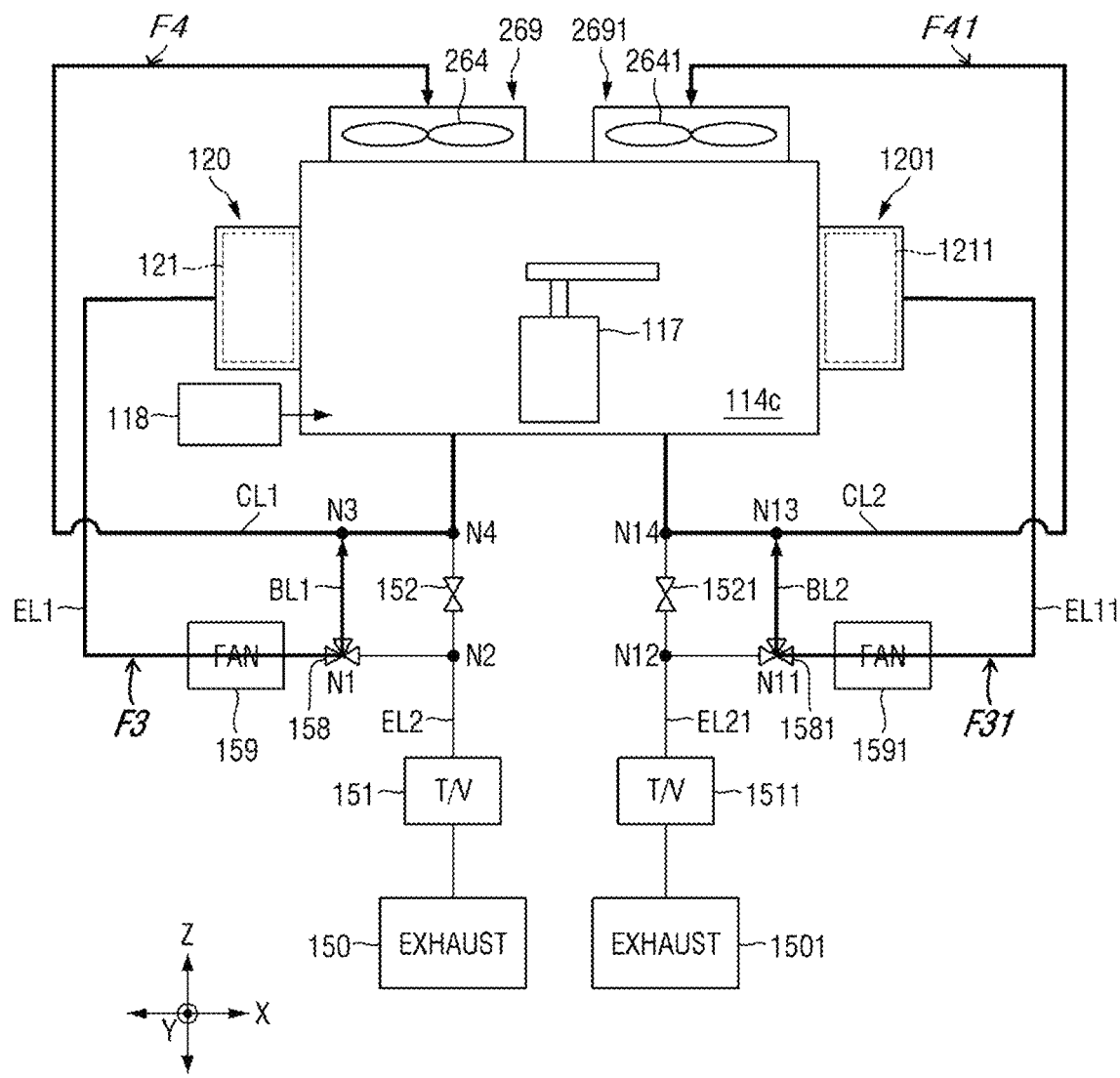
FIG. 5 is a diagram explaining a second operation of the equipment front end module according to the first embodiment of the present disclosure.

FIG. 5 is a diagram explaining a second operation of the equipment front end module according to the first embodiment of the present disclosure.

Referring to FIG. 5, a case where the equipment front end module is in a circulation mode will be provided.

The first on-off valve 152 and the second on-off valve 1521 are in an off-state, and the three-way valves 158 and 1581 are in the first position.

The inert gas in the module chamber 114c flows along the first exhaust line EL1 through the first side storage 120, and is supplied from the third node N3 to the first circulation line CL1 through the three-way valve 158 (see reference numeral F3).

In addition, the inert gas in the module chamber 114c flows along the second exhaust line EL2 from the bottom surface of the module chamber 114c. The inert gas of the second exhaust line EL2 is joined with the first circulation line CL1 at the fourth node N4. The inert gas flows along the first circulation line CL1 and is supplied to the first fan filter unit 269 (see reference numeral F4). The inert gas in the first fan filter unit 269 is sufficiently diffused and supplied into the module chamber 114c.

Similarly, the inert gas in the module chamber 114c flows along the third exhaust line EL11 through the second side storage 1201 and is supplied from the seventh node N13 to the second circulation line CL2 through the three-way valve 1581 (see reference numeral F31).

In addition, the inert gas in the module chamber 114c flows along the fourth exhaust line EL21 from the bottom surface of the module chamber 114c. The inert gas of the fourth exhaust line EL21 is joined with the second circulation line CL2 at the eighth node N14. The inert gas flows along the second circulation line CL2 and is supplied to the second fan filter unit 2691 (see reference numeral F41). The inert gas is sufficiently diffused in the second fan filter unit 2691 and supplied into the module chamber 114c.

Although this is not illustrated separately, the circulation mode also includes that some of the inert gas flowing along the exhaust lines EL1 and EL11 are circulated through the circulation lines CL1 and CL2, while the other inert gas is exhausted by the exhaust devices 150 and 1501.

Figure 6:
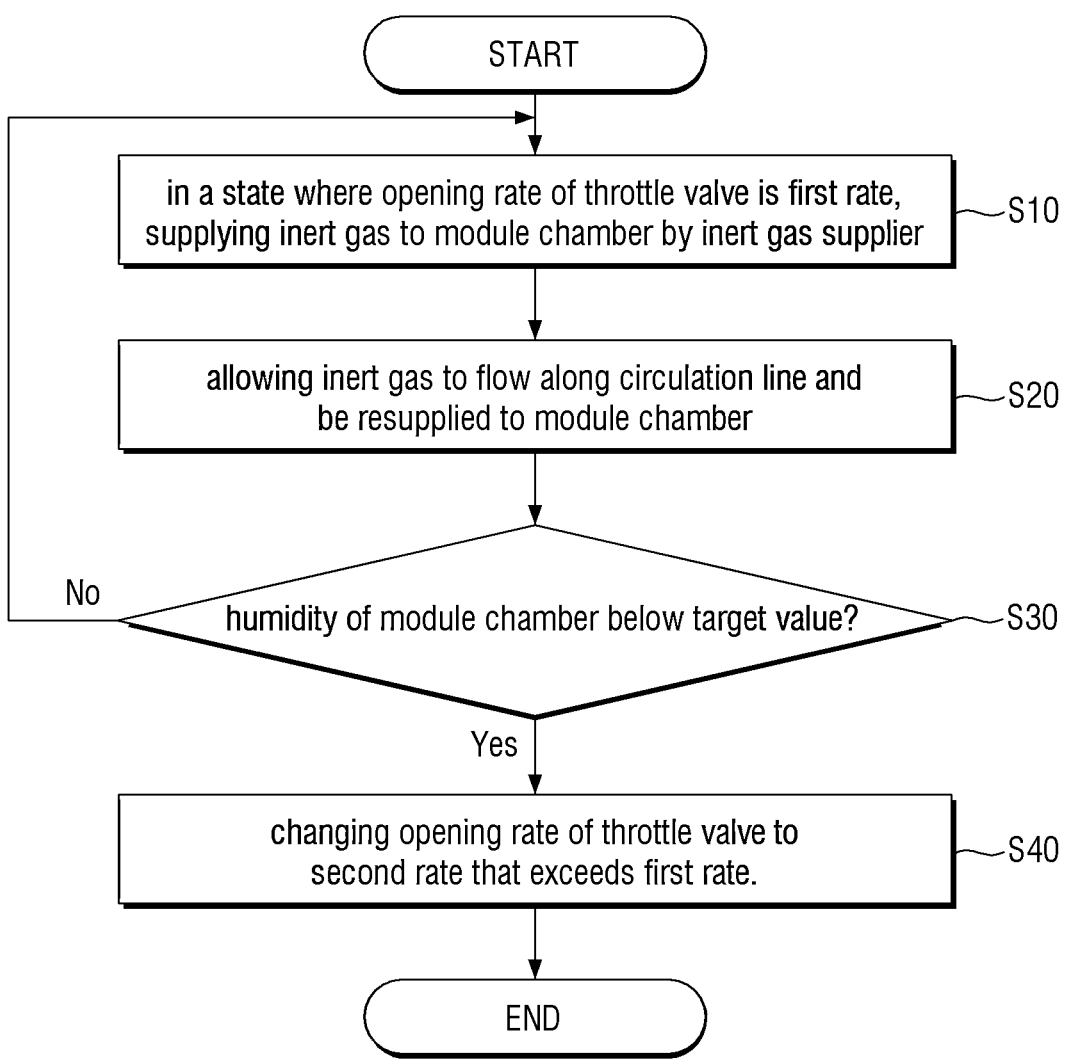
FIG. 6 is a flowchart explaining a third operation of the equipment front end module according to the first embodiment of the present disclosure.

FIG. 6 is a flowchart explaining a third operation of the equipment front end module according to the first embodiment of the present disclosure. For convenience of explanation, the differences from the content described using FIGS. 1 to 5 will be mainly described.

Referring to FIGS. 2 and 6, in the state where the opening rates of the throttle valves 151 and 1511 are the first rate, the inert gas supplier 118 supplies the inert gas to the module chamber 114c (S10). Herein, the on-off valves 152 and 1521 may be in an on-state, and the three-way valves 158 and 1581 may be in the third position.

Then, the inert gas flows along the circulation lines CL1 and CL2 and is resupplied to the module chamber 114c (S20).

Specifically, a process where the inert gas is circulated to the module chamber 114c along the first circulation line CL1 is as follows.

Some of the inert gas flowing along the first exhaust line EL1 may pass through the third node N3 and be supplied back to the module chamber 114c along the first circulation line CL1, while the other inert gas may pass through the second node N2 and be exhausted to the first exhaust device 150. In addition, some of the inert gas discharged from the bottom surface of the module chamber 114c to the second exhaust line EL2 may be supplied from the fourth node N4 to the first circulation line CL1, while the other inert gas may be exhausted to the first exhaust device 150 through the second node N2.

A process where the inert gas is circulated to the module chamber 114c along the second circulation line CL2 is substantially the same as described above.

Then, it is checked whether the humidity of the module chamber 114c is below or equal to a target value (S30).

Specifically, the humidity of the module chamber 114c may be checked based on a value measured by the humidity sensor in the module chamber 114c. The target value may be a preset value but may vary according to the design. The target value may be, for example, 1% humidity.

When the humidity exceeds the target value (No in S30), step S10 is returned, and steps S10 and S20 are performed again.

When the humidity is below or equal to the target value (Yes in S30), step S40 is performed.

The opening rate of the throttle valves 151 and 1511 is changed to the second rate that exceeds the first rate (S40).

Specifically, when the humidity is too low, the surface of the substrate W may be excessively dry, and thus defects may easily occur in the substrate W. In the state where the inert gas supplier 118 supplies the inert gas to the module chamber 114c, an increase of the opening rate of the throttle valves 151 and 1511 leads to an increase of the humidity.

Although this is not illustrated separately in the drawings, the inert gas supplier 118 continues to supply the inert gas to the module chamber 114c in the state where the opening rate of the throttle valves 151 and 1511 is the second rate. When the humidity of the module chamber 114c increases to a limit value, the opening rate of the throttle valves 151 and 1511 is lowered again to the first rate.

In this way, the humidity of the module chamber 114c may be controlled to be positioned between the target value and the limit value.

Figure 7:
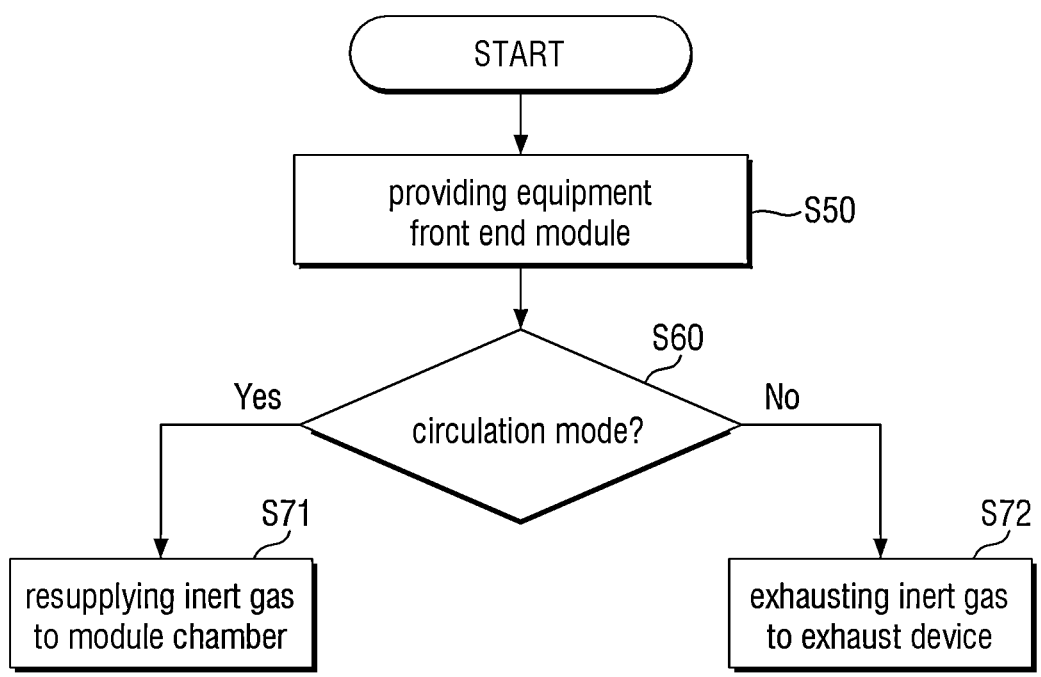
FIG. 7 is a flowchart explaining a fourth operation of an equipment front end module according to the first embodiment of the present disclosure.

FIG. 7 is a flowchart explaining a fourth operation of an equipment front end module according to the first embodiment of the present disclosure. For convenience of explanation, the difference from the content described using FIGS. 1 to 5 will be mainly described.

Referring to FIGS. 2 and 7, first, the equipment front end module is provided (S50).

Specifically, the equipment shear module 114 includes the module chamber 114c, the side storage 120 and 1201 installed on one surface of the module chamber 114c and capable of storing the plurality of substrates therein, the inert gas supplier 118 configured to supply the inert gas into the module chamber 114c, the exhaust lines EL1 and EL11 configured to connect the side storage 120 and 1201 and the exhaust devices 150 and 1501, the connection lines BL1 and BL2 configured to connect the exhaust lines EL1 and EL11 and the circulation lines CL1 and CL2, and the three-way valves 158 and 1581 installed in the node N1 and N11 where the exhaust lines EL1 and EL11 and the connecting lines BL1 and BL2 are connected. Furthermore, the equipment front end module 114 may further include other exhaust lines EL2 and EL21 connected to the circulation lines CL1 and CL2.

Then, it is checked whether the equipment shear module 114 is in the circulation mode (S60).

When the equipment shear module 114 is in the circulation mode (Yes in S60), the inert gas is supplied back to the module chamber 114c (S71).

Specifically, as illustrated in FIG. 5, the inert gas flowing along the exhaust lines EL1 and EL11 passes through the connection lines BL1 and BL2 and the circulation lines CL1 and CL2 and is supplied back to the module chamber 114c (see reference numerals F3 and F31 of FIG. 5). Furthermore, the inert gas passes through the exhaust lines EL2 and EL21 and the circulation lines CL1 and CL2 and is supplied back to the module chamber 114c (see reference numerals F4 and F41 of FIG. 5).

When the equipment shear module 114 is in the exhaust mode (No in S60), the inert gas is exhausted to the exhaust devices 150 and 1501 (S72).

Specifically, as illustrated in FIG. 4, the inert gas flowing along the exhaust lines EL1 and EL11 is exhausted to the exhaust devices 150 and 1501 through the three-way valves 158 and 1581 and the throttle valves 151 and 1511 (see reference numerals F1 and F11 of FIG. 4). Furthermore, the inert gas is exhausted to the exhaust devices 150 and 1501 through the exhaust lines EL2 and EL21 and the throttle valves 151 and 1511 (see reference numerals F2 and F21 of FIG. 4).

Figure 8:
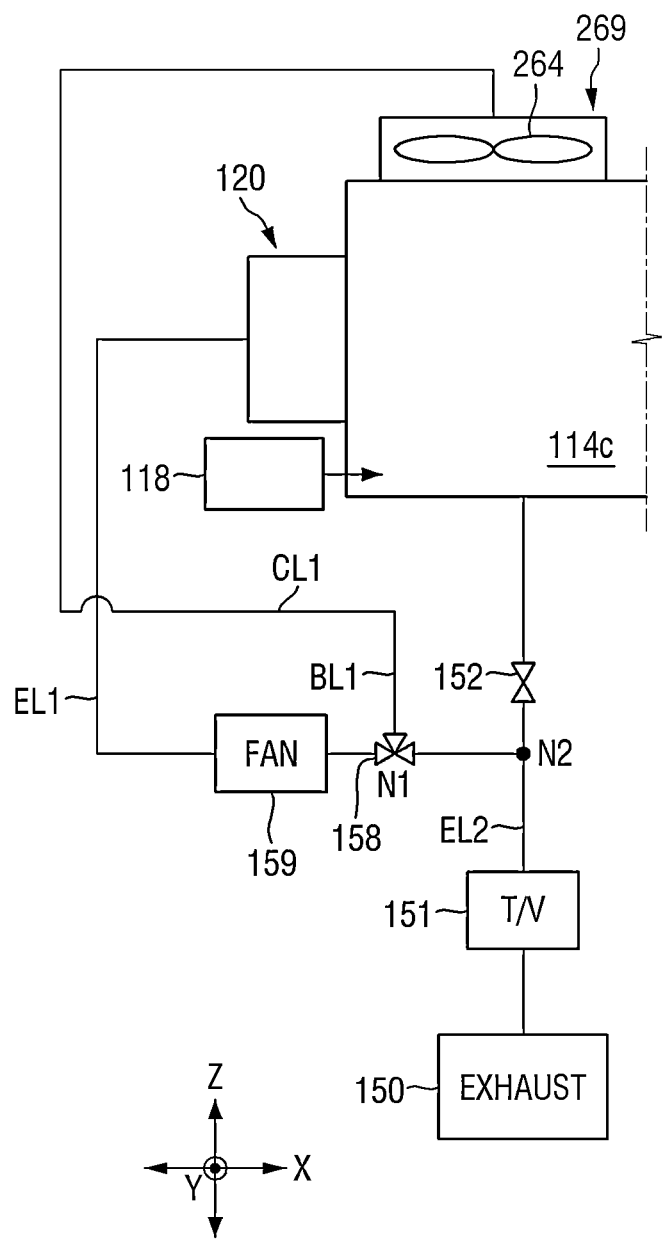
FIG. 8 is a block diagram explaining the equipment front end module according to a second embodiment of the present disclosure.

FIG. 8 is a block diagram explaining the equipment front end module according to a second embodiment of the present disclosure. The differences from the content described using FIG. 2 will be mainly described.

In the equipment front end module illustrated in FIG. 2, the inert gas flowing along the first exhaust line EL1 through the first side storage 120 may be circulated from the three-way valve 158 installed in the first node N1 to the first circulation line CL1. Furthermore, the inert gas flowing along the second exhaust line EL2 from the bottom surface of the module chamber 114c may also be circulated from the fourth node N4 to the first circulation line CL1.

On the other hand, in the equipment front end module illustrated in FIG. 8, the inert gas flowing along the second exhaust line EL2 from the bottom surface of the module chamber 114c is not circulated. In other words, the inert gas is exhausted to the exhaust device 150 through the first on-off valve 152 and the first throttle valve 151.

Figure 9:
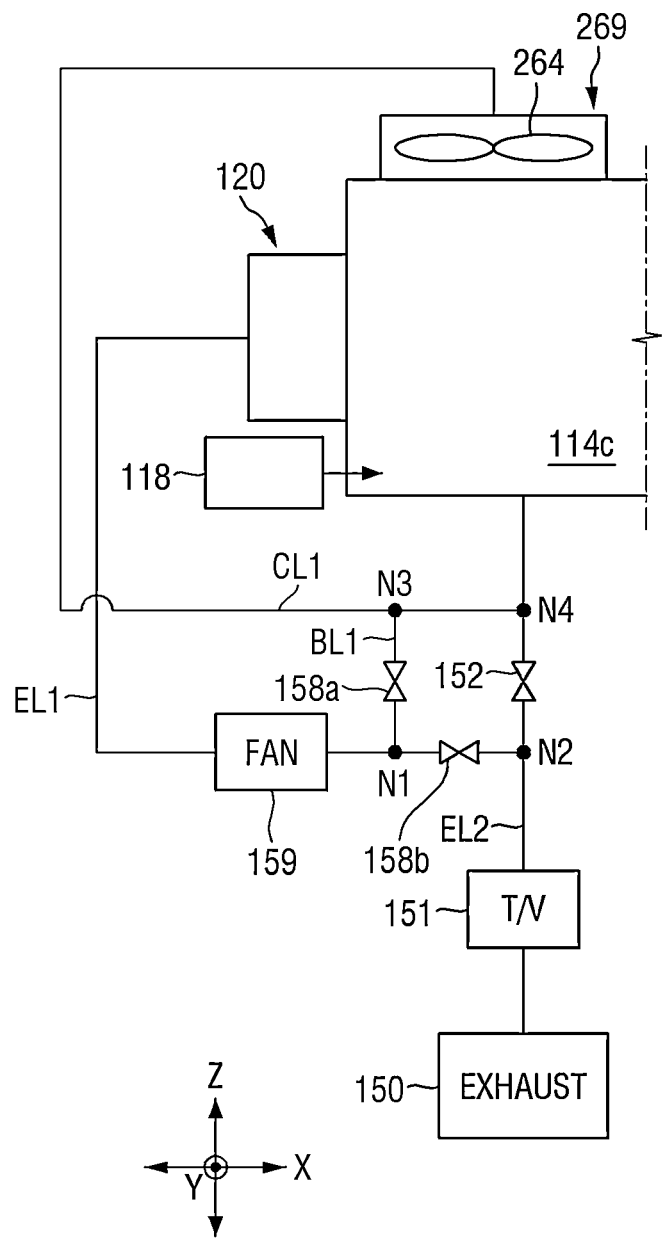
FIG. 9 is a block diagram explaining the equipment front end module according to a third embodiment of the present disclosure.

FIG. 9 is a block diagram explaining the equipment front end module according to a third embodiment of the present disclosure. The differences from the content described using FIG. 2 will be mainly described.

In the equipment front end module illustrated in FIG. 2, one three-way valve 158 installed in the first node N1 may circulate or exhaust the inert gas flowing along the first exhaust line EL1.

On the other hand, the equipment front end module illustrated in FIG. 9 may circulate or exhaust the inert gas flowing along the first exhaust line EL1 by the operation of a valve 158b installed between the first node N1 and the second node N2 and a valve 158a installed between the first node N1 and the third node N3.

When the valve 158b is turned off and the valve 158a is turned on, the inert gas flowing along the first exhaust line EL1 may be circulated to the module chamber 114c.

When the valve 158b is turned on and the valve 158a is turned off, the inert gas flowing along the first exhaust line EL1 can be exhausted to the exhaust device 150.

Figure 10:
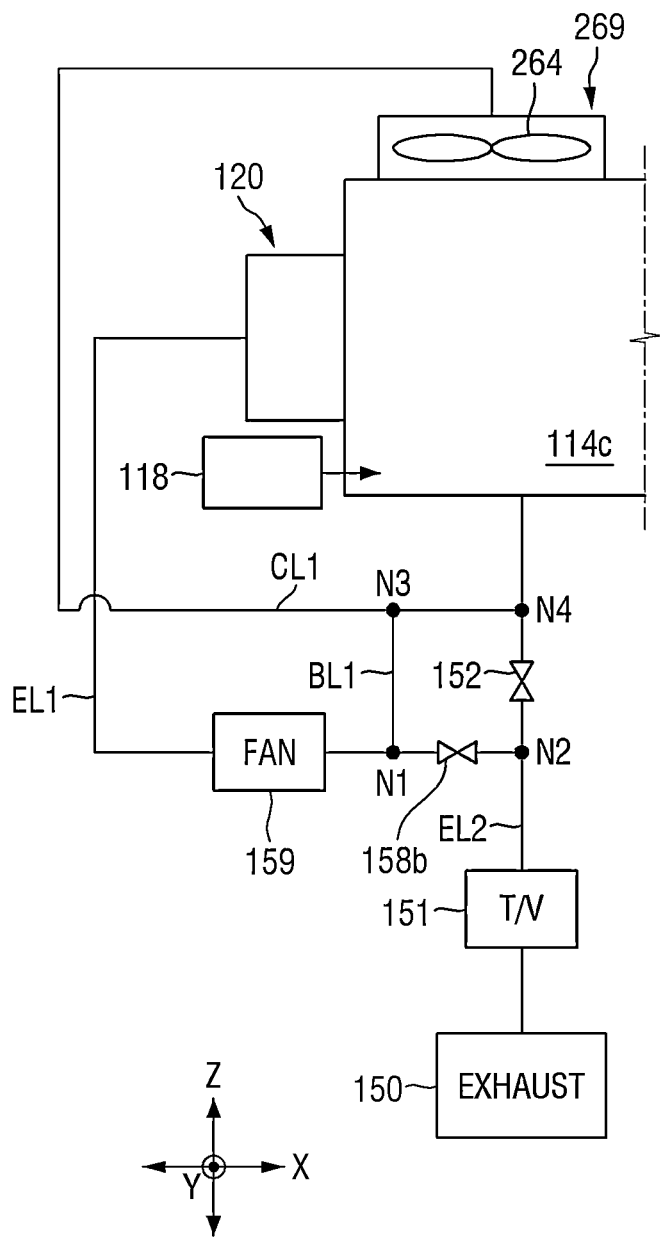
FIG. 10 is a block diagram explaining the equipment front end module according to a fourth embodiment of the present disclosure.

FIG. 10 is a block diagram explaining the equipment front end module according to a fourth embodiment of the present disclosure. The differences from the content described using FIG. 9 will be mainly described.

The equipment front end module shown in FIG. 10 is provided with a valve 158b installed between the first node N1 and the second node N2; however, a valve is not installed between the first node N1 and the third node N3.

When the valve 158b is in the off-state, the inert gas flowing along the first exhaust line EL1 may be circulated to the module chamber 114c.

When the valve 158b is in the on-state, some of the inert gas flowing along the first exhaust line EL1 is circulated to the module chamber 114c, while the other inert gas is exhausted to the exhaust device 150.

Figure 11:
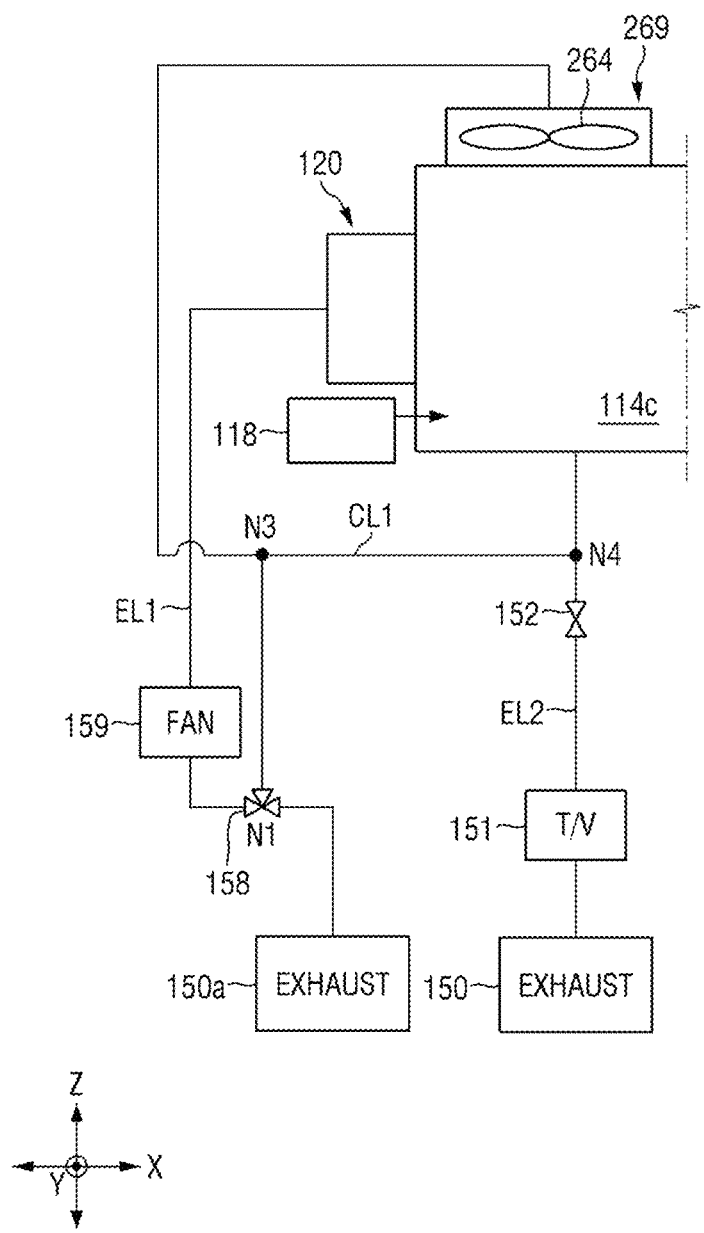
FIG. 11 is a block diagram explaining the equipment front end module according to a fifth embodiment of the present disclosure.

FIG. 11 is a block diagram explaining the equipment front end module according to a fifth embodiment of the present disclosure. The differences from the content described using FIG. 2 will be mainly described.

Referring to FIG. 11, in the equipment front end module according to the fifth embodiment of the present disclosure, an exhaust device 150a connected to the first exhaust line EL1 may be different from the exhaust device 150 connected to the second exhaust line EL2.

Figure 12:
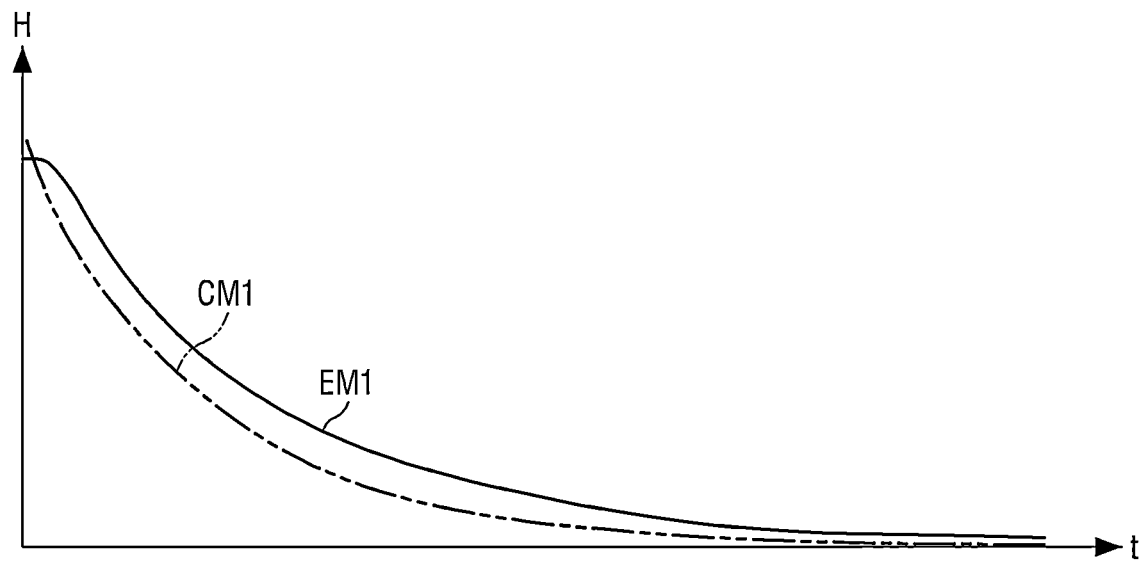
FIGS. 12 and 13 are view explaining the effect of the equipment front end module according to some embodiments of the present disclosure.
Figure 13:
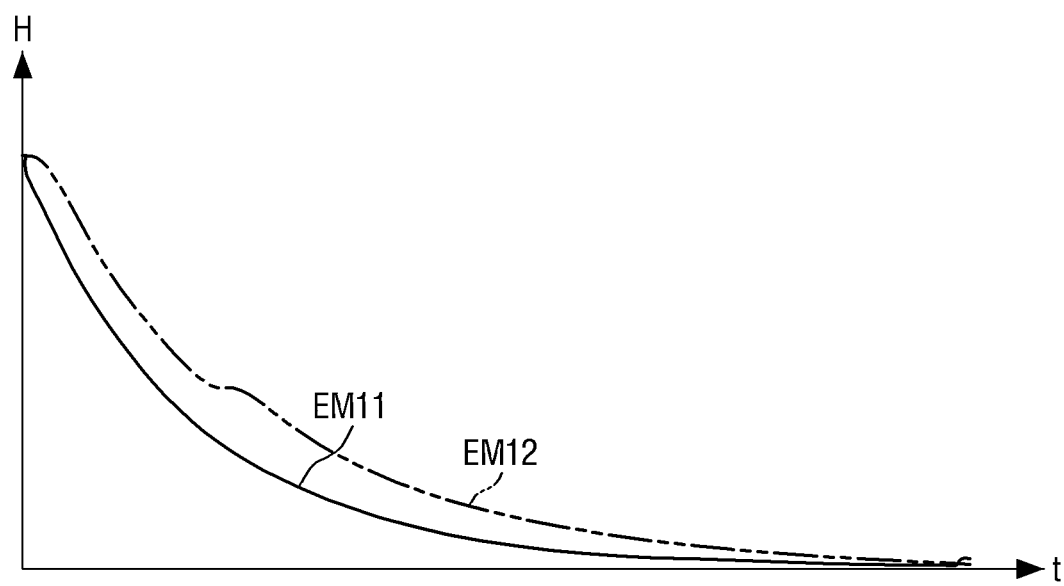

FIGS. 12 and 13 are view explaining the effect of the equipment front end module according to some embodiments of the present disclosure Referring to FIG. 12, the humidity of the module chamber 114c can be efficiently controlled by using the circulation mode.

The X-axis represents time, while the Y-axis represents humidity.

CM1 represents a change in humidity over time when the equipment front end module operates in the circulation mode.

In the circulation mode, the three-way valves 158 and 1581 (see FIG. 5) are in the first position. Therefore, the inert gas in the module chamber 114c flows through the first side storage 120 along the first exhaust line EL1 and is supplied from the third node N3 to the first circulation line CL1 through the three-way valve 158 (see reference numeral F3 of FIG. 5).

EM1 represents a change in humidity over time when the equipment front end module operates in the exhaust mode.

In the exhaust mode, the three-way valves 158 and 1581 are in the second position. Accordingly, the inert gas in the module chamber 114c flows along the first exhaust line EL1 through the first side storage 120 and is supplied to the first exhaust line EL1 through the three-way valve 158 (see reference numeral F1 of FIG. 4).

It may be seen that the humidity of CM1 decreases more quickly than that of EM1 over time. Accordingly, the inert gas may be efficiently circulated using the circulation mode, and the humidity in the module chamber 114c can be quickly reduced below the target value.

Referring to FIG. 13, a humidity control time may be optimized according to the rotation speed of the fans 264 and 2641 (see FIG. 2) of the fan filter units 269 and 2691 (see FIG. 2).

The X-axis represents time, while the Y-axis represents humidity.

Assuming that all other conditions are identical, the fans 264 and 2641 of the fan filter units 269 and 2691 of EM11 are rotated at a first speed (e.g., 1000 RPM), and the fans 264 and 2641 of the fan filter units 269 and 2691 of EM12 are rotated at a second speed (e.g., 600 RPM) slower than the first speed.

It may be seen that the humidity of EM11 decreases more quickly than that of EM12. Accordingly, the fans 264 and 2641 of the fan filter units 269 and 2691 can be quickly rotated, which makes it possible to quickly lower the humidity in the module chamber 114c below the target value.

Although the embodiments of the present disclosure have been described above with reference to the accompanying drawings, the present disclosure is not limited to the disclosed embodiments, but may be implemented in various different ways, and the present disclosure may be embodied in many different forms without changing technical subject matters and essential features as will be understood by those skilled in the art. Therefore, embodiments set forth herein are exemplary only and not to be construed as a limitation.

What is claimed is:

1. An equipment front end module, comprising:
a module chamber;
a side storage installed on a first surface of the module chamber and capable of storing a plurality of substrates therein;
an inert gas supplier configured to supply an inert gas into the module chamber;
a first exhaust line configured to connect the side storage and an exhaust device; and
a flow rate controller installed in the first exhaust line;
a circulation line configured to circulate the inert gas; and
a connection line connecting the first exhaust line and the circulation line,
wherein the inert gas passes through the side storage from the module chamber and flows along the first exhaust line, and the flow rate controller controls a flow rate of the inert gas passing through the side storage, and
wherein the first exhaust line and the connection line are connected to each other at a first node, and a three-way valve is installed in the first node.

2. The equipment front end module of claim 1, wherein the module chamber includes a second surface different from the first surface, and
the equipment front end module further comprises a second exhaust line configured to connect the second surface of the module chamber and the exhaust device.

3. The equipment front end module of claim 2, wherein the first exhaust line is connected to the second exhaust line, and
the inert gas passes through the side storage from the module chamber, flows along the first and second exhaust lines and is exhausted to the exhaust device.

4. The equipment front end module of claim 2, wherein the circulation line is connected to at least one of the first exhaust line and the second exhaust line.

5. The equipment front end module of claim 4, further comprising a fan filter unit installed on an upper surface of the module chamber,
wherein the circulation line connects the first and second exhaust lines to the fan filter unit, and
at least a part of the inert gas flowing along the first exhaust line and at least a part of the inert gas flowing along the second exhaust line flow along the circulation line and are supplied to the fan filter unit.

6. The equipment front end module of claim 4, wherein a throttle valve is installed in the second exhaust line, and an opening rate of the throttle valve is adjusted to control the amount of the exhausted inert gas.

7. The equipment front end module of claim 6, wherein, in a state where the opening rate of the throttle valve is a first rate, the inert gas supplier supplies the inert gas to the module chamber,
the inert gas flows along at least one of the first exhaust line and the second exhaust line from the module chamber and is supplied to the circulation line, and the inert gas flows along the circulation line and is resupplied to the module chamber, and
when the humidity of the module chamber is below or equal to a target value, the opening rate of the throttle valve is changed to a second rate that exceeds the first rate.

8. The equipment front end module of claim 2, wherein the first and second exhaust lines are connected to each other at a second node, a throttle valve is installed at the rear of the second node, and the opening rate of the throttle valve is adjusted to control the amount of the inert gas flowing along the first and second exhaust lines and exhausted to the exhaust device.

9. The equipment front end module of claim 8, wherein the circulation line and the second exhaust line are connected to each other at a third node, and an on-off valve is installed between the third node and the second node.

10. The equipment front end module of claim 1, wherein the inert gas supplier supplies the inert gas through a sidewall of the module chamber.

11. The equipment front end module of claim 10, wherein a differential pressure sensor is installed in the module chamber,
wherein based on a sensing value of the differential pressure sensor, the inert gas supplier controls the supply amount of the inert gas supplied into the module chamber.

12. The equipment front end module of claim 1, wherein the flow rate controller includes at least one fan.

13. A substrate processing apparatus, comprising:
an equipment front end module;
a load port disposed on a first surface of the equipment front end module and configured to accommodate a substrate carrier; and
a load lock device disposed on a second surface of the equipment front end module,
wherein the equipment front end module comprises:
a module chamber;
a fan filter unit installed on an upper surface of the module chamber;
a side storage installed on a side surface of the module chamber and capable of storing a plurality of substrates therein;

an inert gas supplier configured to supply an inert gas into the module chamber through the side surface of the module chamber;

a first exhaust line configured to connect the side storage and an exhaust device;

a flow rate controller installed in the first exhaust line and configured to control a speed of the inert gas flowing along the first exhaust line, a second exhaust line configured to connect a bottom surface of the module chamber and the exhaust device; and a circulation line connected to the first exhaust line and the second exhaust line and configured to resupply the inert gas transmitted through the first and second exhaust lines to the fan filter unit, wherein the substrate processing apparatus further comprises a connection line configured to connect the first exhaust line and the circulation line, and wherein the first exhaust line and the connection line are connected to each other at a first node, and a three-way valve is installed in the first node.

14. The substrate processing apparatus of claim 13, wherein the first and second exhaust lines are connected to each other at a second node, a throttle valve is installed at the rear of the second node, and the opening rate of the throttle valve is adjusted to control the amount of the inert gas flowing along the first and second exhaust lines and exhausted to the exhaust device.

15. The substrate processing apparatus of claim 14, wherein a circulation mode and an exhaust mode are determined by the operation of the three-way valve, wherein, in the circulation mode, at least a part of the inert gas flowing along the first exhaust line passes through the circulation line and is supplied to the fan filter unit, and in the exhaust mode, the inert gas flowing along the first exhaust line passes through the second exhaust line and is exhausted to the exhaust device.

16. The substrate processing apparatus of claim 14, wherein the circulation line and the second exhaust line are connected to each other at a third node, and an on-off valve is installed between the third node and the second node.

17. An operating method of an equipment front end module, the method comprising:

providing an equipment front end module comprising: a module chamber; a side storage installed on a first surface of the module chamber and capable of storing a plurality of substrates therein; an inert gas supplier configured to supply an inert gas into the module chamber; a first exhaust line configured to connect the side storage and the exhaust device; a connection line configured to connect the first exhaust line and a circulation line; and a three-way valve installed in a node where the first exhaust line is connected to the connection line;

when the three-way valve is in a first position, allowing at least a part of the inert gas flowing along the first exhaust line to pass through the connection line and the circulation line and be resupplied to the module chamber, and when the three-way valve is in a second position, exhausting the inert gas flowing along the first exhaust line to the exhaust device.

18. The operating method of the equipment front end module of claim 17, further comprising a second exhaust line configured to connect a second surface of the module chamber and the exhaust device, wherein a throttle valve is installed in the second exhaust line, and an opening rate of the throttle valve is adjusted to control the amount of the inert gas flowing along the first exhaust line and exhausted to the exhaust device.

* * * * *